United States Patent
Sirasao et al.

(10) Patent No.: US 10,943,039 B1
(45) Date of Patent: Mar. 9, 2021

(54) SOFTWARE-DRIVEN DESIGN OPTIMIZATION FOR FIXED-POINT MULTIPLY-ACCUMULATE CIRCUITRY

(71) Applicant: Xilinx, Inc., San Jose, CA (US)

(72) Inventors: Ashish Sirasao, San Jose, CA (US); Elliott Delaye, San Jose, CA (US); Sean Settle, San Jose, CA (US); Zhao Ma, San Jose, CA (US); Ehsan Ghasemi, San Jose, CA (US); Xiao Teng, San Jose, CA (US); Aaron Ng, San Jose, CA (US); Jindrich Zejda, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 188 days.

(21) Appl. No.: 15/786,105

(22) Filed: Oct. 17, 2017

(51) Int. Cl.
 *G06F 30/327* (2020.01)
 *G06F 7/544* (2006.01)
 *G06N 3/04* (2006.01)
 *G06F 30/34* (2020.01)

(52) U.S. Cl.
 CPC .......... *G06F 30/327* (2020.01); *G06F 7/5443* (2013.01); *G06F 30/34* (2020.01); *G06N 3/04* (2013.01); *G06F 2207/4812* (2013.01)

(58) Field of Classification Search
 CPC ........ H03M 3/412–422; G06F 7/49942; G06F 30/327; G06F 30/34; G06F 7/5443
 See application file for complete search history.

(56) References Cited

U.S. PATENT DOCUMENTS

| | | | |
|---|---|---|---|
| 6,346,825 B1 | 2/2002 | Pang et al. | |
| 2006/0126833 A1* | 6/2006 | O'Leary | H04L 9/0668 380/30 |
| 2016/0328645 A1* | 11/2016 | Lin | G06N 20/00 |
| 2016/0358070 A1* | 12/2016 | Brothers | G06N 3/0454 |
| 2017/0102921 A1* | 4/2017 | Henry | G06N 3/063 |

OTHER PUBLICATIONS

Na et al., "Speeding up Convolutional Neural Network Training with Dynamic Precision Scaling and Flexible Multiplier-Accumulator", Proceedings of the 2016 International Symposium on Low Power Electronics and Design, Aug. 2016 (Year: 2016).*
Gigliotti, Paul. "Implementing Barrel Shifters Using Multipliers", Aug. 2004. (Year: 2004).*
Altera, "FIR II IP Core", Chapter 3, p. 1-6, May 2016 (Year: 2016).*
Wikipedia, "Shift Register" (Year: 2017).*

(Continued)

*Primary Examiner* — Jack Chiang
*Assistant Examiner* — Aric Lin
(74) *Attorney, Agent, or Firm* — Patterson + Sheridan, LLP

(57) ABSTRACT

An example multiply accumulate (MACC) circuit includes: a multiply-accumulator having an accumulator output register; a quantizer, coupled to the multiply accumulator; and a control circuit coupled to the multiply-accumulator and the quantizer, the control circuit configured to provide control data to the quantizer, the control data indicative of a most-significant bit (MSB) to least significant bit (LSB) range for selecting bit indices from the accumulator output register.

20 Claims, 14 Drawing Sheets

(56) References Cited

OTHER PUBLICATIONS

Akesson, Benny, "An introduction to SDRAM and memory controllers," downloaded Sep. 25, 2017 from http://www.es.ele.tue.nl/premadona/files/akesson01.pdf, pp. 1-30, Eindhoven University of Technology, Eindhoven, The Netherlands.
Chetlur, Sharan et al., "cuDNN: Efficient Primitives for Deep Learning," submitted Oct. 3, 2014, pp. 1-9, https://arxiv.org/pdf/1410.0759.pdf, Cornell University Library.
Di Carlo, Stefano et al., "An Area-Efficient 2-D Convolution Implementation on FPGA for Space Applications," Proc. of the 2011 IEEE 6th International Design & Test Workshop, Dec. 11, 2011, pp. 88-92, IEEE, Piscataway, New Jersey, USA.
Gysel, Philipp, "Ristretto: Hardware-Oriented Approximation of Convolutional Neural Networks," May 20, 2016, pp. 1-73, https://arxiv.org/abs/1605.06402, Cornell University Library.
Khronos, "clSetKernelArg," downloaded Sep. 22, 2017 from https://www.khronos.org/registry/OpenCL/sdk/1.0/docs/man/xhtml/clSetKernelArg.html, copyright 2007, pp. 1-4, Khronos Group, Beaverton, Oregon, USA.
Krizhevsky, Alex et al., "ImageNet Classification with Deep Convolutional Neural Networks," Proc. of the 12th International Conference on Neural Processing Systems, Dec. 3, 2012, pp. 1097-1105, ACM Digital Library, www.acm.org.
Mathworks, "im2col," dowloaded Sep. 22, 2017 from https://www.mathworks.com/help/images/ref/im2col.html?searchHighlight=im2col&s_tid=doc_srchtitle, pp. 1-3.
Saxena, Abhineet, "Convolutional Neural Networks (CNNs): An Illustrated Explanation," Jun. 20, 2016, downloaded Sep. 25, 2017 from http://xrds.acm.org/blog/2016/06/convolutional-neural-networks-cnns-illustrated-explanation/, pp. 1-15.
Shaaban, Muhammed, "Systolic Architectures," Mar. 11, 2003, Kate Gleason College of Engineering, Rochester Institute of Technology, Rochester, New York, USA.
Stanford, "CS231n Convolutional Neural Networks for Visual Recognition," downloaded Sep. 25, 2017 from http://cs231n.stanford.edu/, pp. 1-23, Stanford University, Stanford, California, USA.
Warden, Pete, "Why GEMM is at the heart of deep learning," Apr. 20, 2015, pp. 1-9, downloaded from https://petewarden.com/2015/04/20/why-gemm-is-at-the-heart-of-deep-learning/.
Wikipedia, "Convolutional neural network," Sep. 20, 2017, pp. 1-13, downloaded from https://en.wikipedia.org/wiki/Convolutional_neural_network.
Wikipedia, "Deep learning," Sep. 24, 2017, pp. 1-13, downloaded from https://en.wikipedia.org/wiki/Deep_learning.
Wikpedia, "Matrix Multiplication," Sep. 20, 2017, pp. 1-19, downloaded from https://en.wikipedia.org/wiki/Matrix_multiplication.
Wikipedia, "Multiprocessing," May 10, 2017, pp. 1-4, dowloaded from https://en.wikipedia.org/wiki/Multiprocessing.
Wikipedia, "Producer-consumer problem," Sep. 7, 2017, pp. 1-9, downloaded from https://en.wikipedia.org/wiki/Producer%E2%80%93consumer_problem.
Wikipedia, "Row- and colum-major order," Aug. 23, 2017, pp. 1-5, downloaded from https://en.wikipedia.org/wiki/Row-_and_column-major_order.
Wikipedia, "Systolic array," Mar. 22, 2017, pp. 1-5, downloaded from https://en.wikipedia.org/wiki/Systolic_array.
Wikipedia, "Very long instruction word," Jul. 13, 2017, pp. 1-3, downloaded from https://en.wikipedia.org/wiki/Very_long_instruction_word.
Xilinx, "Smarter Data Center," downloaded Sep. 22, 2017 from https://www.xilinx.com/applications/data-center.html, pp. 1-4, Xilinx, Inc., San Jose, California, USA.
Xilinx, "SDSoC Development Environment," downloaded Sep. 22, 2017 from https://www.xilinx.com/products/design-tools/software-zone/sdsoc.html, pp. 1-16, Xilinx, Inc., San Jose, California, USA.
Xilinx, "UltraScale Architecture DSP Slice User Guide," UG579 (v1.3), Nov. 24, 2015, pp. 1-74, Xilinx, Inc., San Jose, California, USA.
Xilinx, "Vivado High-Level Synthesis," downloaded Sep. 22, 2017 from https://www.xilinx.com/products/design-tools/vivado/integration/esl-design.html, pp. 1-2, Xilinx, Inc., San Jose, California, USA.
Xilinx, "Deep Learning with INT8 Optimization on Xilinx Devices," WP486 (v1.0.1), Apr. 24, 2017, pp. 1-11, Xilinx, Inc., San Jose, California, USA.
Xilinx, "Implementing Memory Structures for Video Processing in the Vivado HLS Tool," XAPP793 (v1.0), Sep. 20, 2012, pp. 1-8, Xilinx, Inc., San Jose, California, USA.
Xilinx, "Two-Dimensional Linear Filtering," XAPP933 (v1.1), Oct. 23, 2007, pp. 1-8, Xilinx, Inc., San Jose, California, USA.

* cited by examiner

| Layer | x_bw | x_fl | y_bw | y_fl | z_bw | z_fl | acc_bw | acc_fl | MSB | LSB |
|---|---|---|---|---|---|---|---|---|---|---|
| 1 | 8 | 0 | 8 | 7 | 8 | -3 | 16 | 7 | 17 | 10 |
| 2 | 8 | -3 | 8 | 7 | 8 | -4 | 16 | 4 | 15 | 8 |
| 3 | 8 | -4 | 8 | 7 | 8 | -4 | 16 | 3 | 14 | 7 |
| 4 | 8 | -4 | 8 | 7 | 8 | -3 | 16 | 3 | 13 | 6 |
| 5 | 8 | -3 | 8 | 7 | 8 | -2 | 16 | 4 | 13 | 6 |

US 10,943,039 B1

SOFTWARE-DRIVEN DESIGN OPTIMIZATION FOR FIXED-POINT MULTIPLY-ACCUMULATE CIRCUITRY

TECHNICAL FIELD

Examples of the present disclosure generally relate to computing systems and electronic circuits and, in particular, to software-driven design optimization for fixed-point multiply-accumulate circuitry.

BACKGROUND

Machine learning is the science of inducing computing systems to act without being explicitly programmed. Classical machine learning includes various clustering and classification techniques, including K-means clustering, linear and logistic regressions, stochastic gradient decent, association rule learning, and the like. Deep learning is a newer frontier in machine learning. Deep learning is a class of machine learning algorithms that uses multiple layers of nonlinear processing units for feature extraction and transformation. Deep learning algorithms can be unsupervised (e.g., pattern analysis) or supervised (e.g., classification). The deep learning algorithm can be implemented using layers of an artificial neural network (ANN) (referred to herein as a "neural network").

In general, a neural network is a collection of nodes (i.e., the "neurons") that are connected in a graph. A node in a neural network computes a sum of weighted inputs and adds an optional bias to the sum. The output of the node is a function of the final sum (referred to as an "activation function"). Example activation functions include the sigmoid function, the hyperbolic tangent (tan h) function, the Rectified Linear Unit (ReLU) function, and the identity function. Neural network models are often organized into layers of nodes, which define a specific topology, and corresponding weights and biases. The weights and biases are referred to as network parameters.

In general, a neural network includes an input layer and an output layer and can optionally include one or more hidden layers between the input and output layers. A neural network used in deep learning applications typically includes many hidden layers, which gives rise to the term deep neural network (DNN). The layers of a neural network can be densely connected (e.g., each node in a layer is fully connected to all nodes in a previous layer) or sparsely connected (e.g., each node in a layer is connected to only a portion of the nodes in a previous layer). A convolutional neural network (CNN) is a type of DNN that includes one or more sparsely connected layers, referred to as convolutional layers. A CNN is well-suited for processing image or video data. Other types of DNNs include recurrent neural network (RNNs), which are well-suited for processing speech and text data.

Convolution operations can be performed using a number of techniques, which are typically limited by the ability to use a large number of digital signal processors (DSPs), the requirement of on-chip buffers, and/or the data access patterns. One example convolution technique creates a shift register of samples that are fed into a DSP array. This technique is limited in terms of not being able to use striding or dilated convolutions in which the convolution window skips columns and rows in the input image. This is due to a conflict between use of the shift registers to cycle through samples in sequence and the stride or dilation that skips or jumps samples in the input image. Accordingly, it is desirable to provide an improved architecture to compute parallel generalized convolutions.

SUMMARY

Techniques for software-driven design optimization for fixed-point multiply-accumulate circuitry are described. In an example, a multiply accumulate (MACC) circuit includes: a multiply-accumulator having an accumulator output register; a quantizer, coupled to the multiply accumulator; and a control circuit coupled to the multiply-accumulator and the quantizer, the control circuit configured to provide control data to the quantizer, the control data indicative of a most-significant bit (MSB) to least significant bit (LSB) range for selecting bit indices from the accumulator output register.

In another example, an integrated circuit (IC) includes: a memory controller configured to access a memory having image data and weight data stored therein; a processor including a plurality of multiply-accumulate (MACC) circuits configured to process the image data and the weight data, each of the MACC circuits including: a multiply-accumulator having an accumulator output register; a quantizer, coupled to the multiply accumulator; and a control circuit coupled to the multiply-accumulator and the quantizer, the control circuit configured to provide control data to the quantizer, the control data indicative of a most-significant bit (MSB) to least significant bit (LSB) range for selecting bit indices from the accumulator output register.

In another example, a method of controlling a multiply-accumulate (MACC) circuit includes: determining control data indicative of a most-significant bit (MSB) to least significant bit (LSB) range for selecting bit indices from an accumulator output register in the MACC; and loading the control data to the MACC circuit to configure a quantizer coupled to the accumulator output register.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
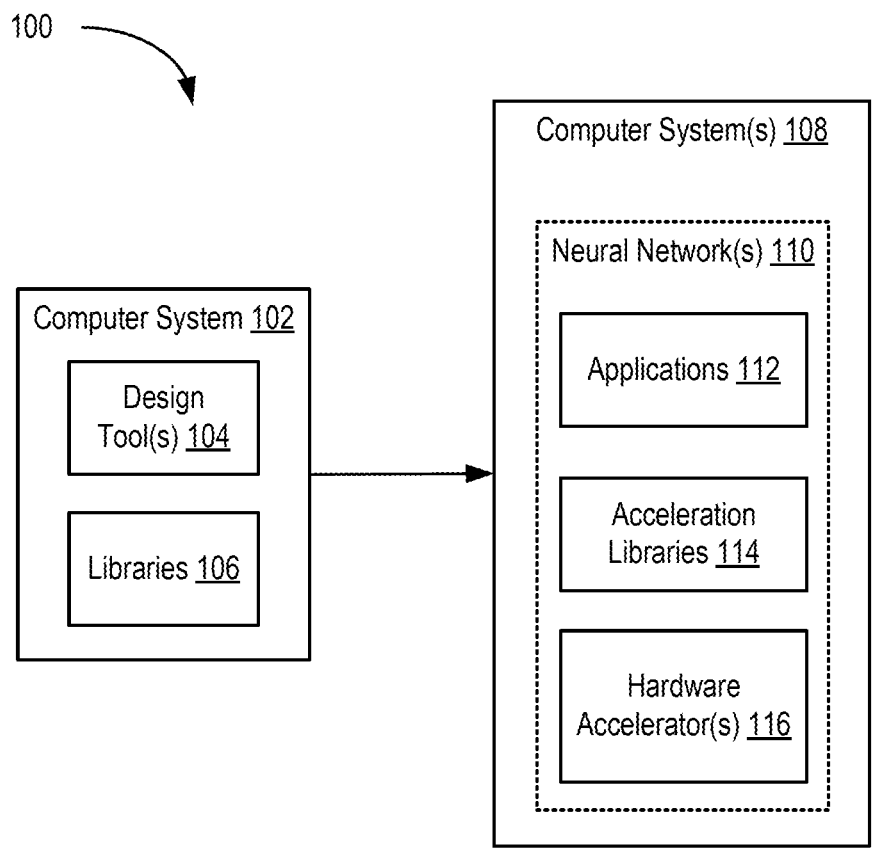
FIG. 1 is a block diagram depicting a system for implementing neural networks according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for image preprocessing are described. An image preprocessor includes an architecture of multiplexers, buffers, and shift registers that can generate a large number of data samples every clock cycle to perform image processing operations, such as convolution. The architecture supports strided or dilated access patterns of the input image data. The architecture allows for implementation of image processing, such as convolution, using a large systolic array, which is particularly useful for implementing convolutional neural networks (CNNs). For convolution, the architecture balances the memory latency of reading the input image against the convolutional size in order to make the convolution run at maximum efficiency with minimal buffers, minimal levels of logic, and reducing memory bandwidth. The architecture also supports various convolutional filter sizes with minimal area penalty, which is advantageous for CNNs that change convolutional filter sizes dynamically. These and further aspects of the architecture are described below with respect to the drawings.

FIG. 1 is a block diagram depicting a system 100 for implementing neural networks according to an example. The system 100 includes a computer system 102 and one or more computer systems 108. The computer system 102 includes conventional computing components configured to execute software that provides one or more design tools 104. Each computer system 108 executes one or more neural networks 110. The neural network(s) 110 are implemented using applications 112, acceleration libraries 114, and one or more hardware accelerators 116.

In an example, the hardware accelerator(s) 116 include programmable integrated circuits (ICs), such as field programmable gate arrays (FPGAs). The acceleration libraries 114 provide application programming interfaces (APIs) to interface with the hardware accelerator(s) 116. The acceleration libraries 114 can also include libraries that provide neural network functions, including predefined and optimized implementations of neural network layers and other types of neural network structures. Thus, the neural network(s) 110 can include both hardware portions implemented in the hardware accelerator(s) 116, as well as software portions implemented in the acceleration libraries 114. The applications 112 invoke the APIs of the acceleration libraries 114 to program and control the hardware accelerator(s) 116 to implement the neural network(s) 116.

A designer interacts with the design tool(s) 104 to define the neural network(s) 110. The design tool(s) 104 can generate files for programming the hardware accelerator(s) 116 (e.g., configuration bitstreams for FPGAs), files that provide the acceleration libraries 114, and files that provide the applications 112. The designer can define the hardware portions of the neural network(s) 110 using a register transfer language (RTL) or using a programming language, such as C, C++, OpenCL, and the like, or a combination of RTL and programmable language(s). The user can define the software portions of the neural network(s) 110 using a programming language, such as C, C++, OpenCL, etc. The design tool(s) 104 compile the software-defined neural networks to generate files for programming the hardware accelerator(s) 116 and library files for the acceleration libraries 114. The designer can make use of libraries 106 that provide class libraries, template libraries, and the like to assist in developing the hardware and software portions of the neural network(s) 110.

A user can define the applications 112 using a programming language (e.g., C, C++, Python, etc.). The user can make use of neural network frameworks and libraries, such as Caffe, TensorFlow, MXNet, and the like.

Figure 2:
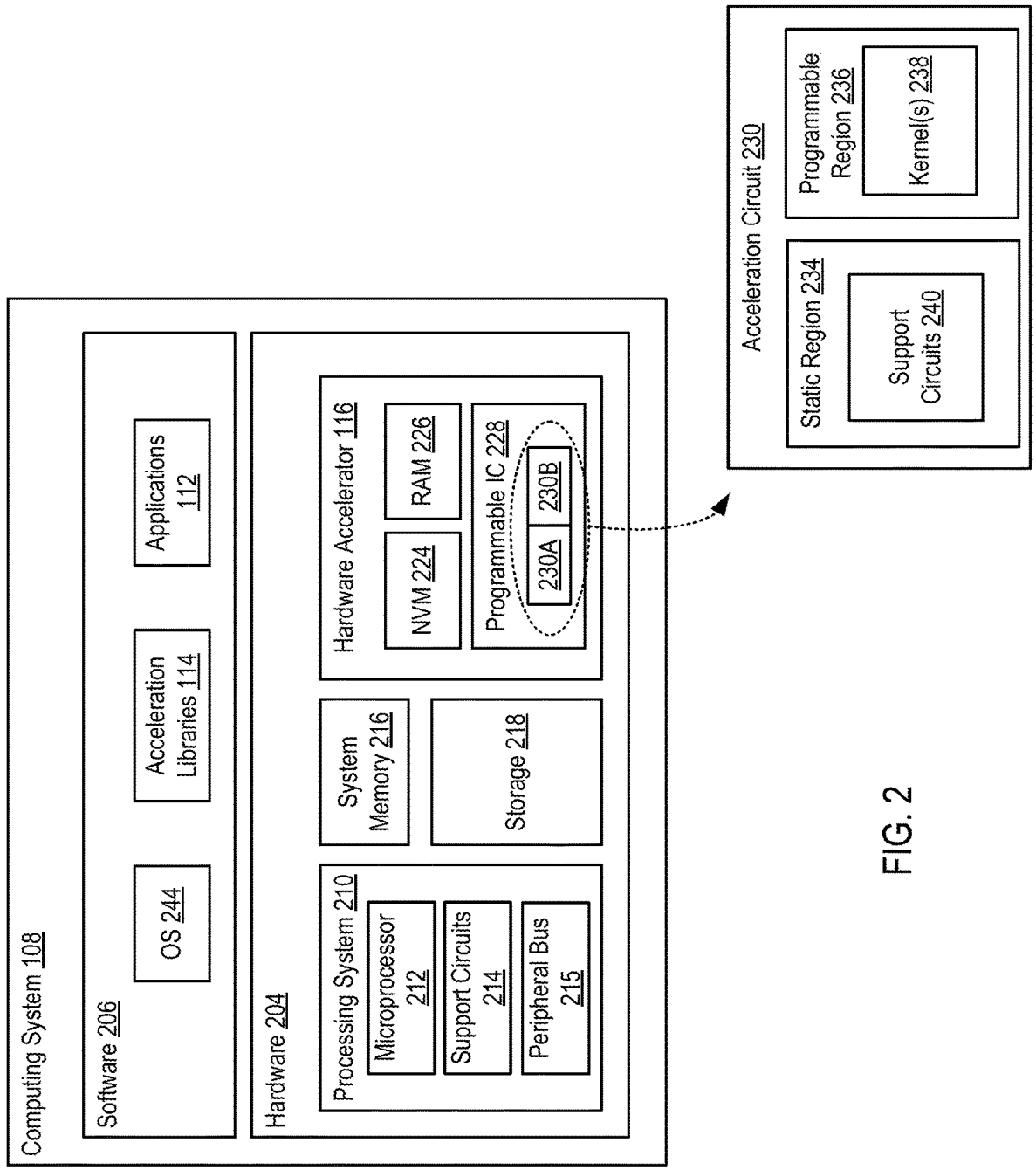
FIG. 2 is a block diagram depicting a computing system according to an example.

FIG. 2 is a block diagram depicting a computing system 108 according to an example. The computing system 108 includes hardware 204 and software 206 executing on the hardware 204. The hardware 204 includes a processing system 210, system memory 1216, storage devices ("storage 218"), and a hardware accelerator 116. The software 206 includes an operating system (OS) 244, the acceleration libraries 114, and the applications 112.

The processing system 210 includes a microprocessor 212, support circuits 214, and a peripheral bus 215. The microprocessor 212 can be any type of general-purpose central processing unit (CPU), such as an x86-based processor, ARM®-based processor, or the like. The microprocessor 212 can include one or more cores and associated circuitry (e.g., cache memories, memory management units (MMUs), interrupt controllers, etc.). The microprocessor 212 is configured to execute program code that perform one or more operations described herein and which can be stored in the system memory 216 and/or the storage 218. The support circuits 214 include various devices that cooperate with the microprocessor 212 to manage data flow between the microprocessor 212, the system memory 216, the storage 218, the hardware accelerator 116, or any other peripheral device. For example, the support circuits 214 can include a chipset (e.g., a north bridge, south bridge, platform host controller, etc.), voltage regulators, firmware (e.g., a BIOS), and the like. The support circuits 214 manage data flow between the microprocessor 212 and the peripheral bus 215, to which various peripherals, such as the hardware accelerator 116, are connected. In some examples, the microprocessor 212 can be a System-in-Package (SiP), System-on-Chip (SoC), or the like, which absorbs all or a substantial portion of the functionality of the chipset (e.g., north bridge, south bridge, etc.). The peripheral bus can implement an expansion bus standard, such as Peripheral Component Interconnect Express (PCIe). In the example, the processing system 210 is shown separate from the hardware accelerator 116. In other examples discussed further below, the processing system 210 and the hardware accelerator 116 can be implemented on the same integrated circuit (IC) using a System-On-Chip (SoC).

The system memory 216 is a device allowing information, such as executable instructions and data, to be stored and retrieved. The system memory 216 can include, for example, one or more random access memory (RAM) modules, such as double-data rate (DDR) dynamic RAM (DRAM). The storage device 218 includes local storage devices (e.g., one or more hard disks, flash memory modules, solid state disks, and optical disks) and/or a storage interface that enables the computing system 108 to communicate with one or more network data storage systems. The hardware 204 can include various other conventional devices and peripherals of a computing system, such as graphics cards, universal serial bus (USB) interfaces, and the like.

The hardware accelerator 116 includes a programmable IC 228, a non-volatile memory 224, and RAM 226. The programmable IC 228 can be an FPGA or the like or an SoC having an FPGA or the like. The NVM 224 can include any type of non-volatile memory, such as flash memory or the like. The RAM 226 can include DDR DRAM or the like. The programmable IC 228 is coupled to the NVM 224 and the RAM 226. The programmable IC 228 is also coupled to the peripheral bus 215 of the processing system 210.

The OS 244 can be any commodity operating system known in the art, such as such as Linux®, Microsoft Windows®, Mac OS®, or the like. The acceleration libraries 114 includes drivers and libraries that provide APIs for command and control of the hardware accelerator 116. The applications 112 include software executing on the microprocessor 212 that invokes the APIs of the acceleration libraries 114 to implement neural network(s).

In operation, the programmable IC 228 is configured with an acceleration circuit 230. The acceleration circuit 230 generally includes a base platform 230A and a kernel 230B. For example, the acceleration circuit 230 can be implemented using a static region 234 and a programmable region 236. The static region 234 includes support circuits 240 for providing an interface to the peripheral bus 215, the NVM 224, and the RAM 226. The programmable region 236 can include one or more kernel circuits ("kernel(s) 238"). The base platform 230A is implemented using the static region 234, and the kernel 230B is implemented using the programmable region 236. In another example, the base platform 230A can also be implemented using a portion of the programmable region 236. Thus, in some examples, the programmable region 236 also includes some interface circuits. In some examples, the acceleration circuit 230 can include more than one programmable region 236, each of which can be individually configured with kernel(s) 238.

The static region 234 is "static" in that the circuitry thereof remains constant across reconfigurations of the programmable region 236. In an example, the support circuits 240 include PCIe endpoint circuits, a direct memory access (DMA) controller, interconnects, a memory controller, a memory interface circuit (e.g., a DDR interface), decoupler circuits (to support partial reconfiguration), flash programmer, debug circuits, and the like. In some examples, the programmable region 236 does not include any of the support circuits 240. In other examples, some support circuits are implemented in the programmable region 236. In such case, the programmable region 236 can be referred to as an "expanded programmable region." In either case, in one example, some support circuits 240 are always present in the static region 234, such as the PCIe circuits and the DMA circuits.

Figure 3:
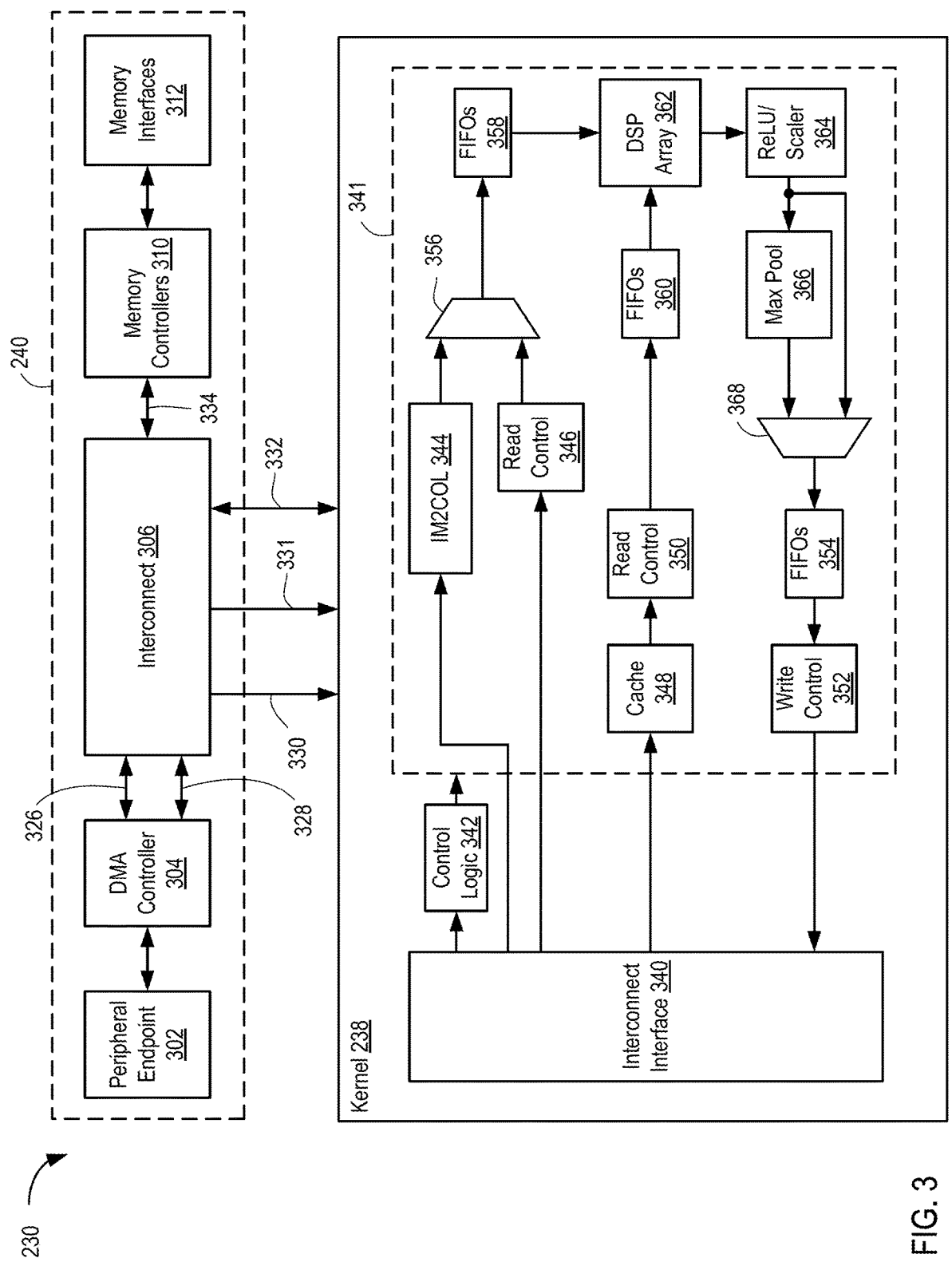
FIG. 3 is a block diagram depicting an acceleration circuit according to an example.

FIG. 3 is a block diagram depicting an acceleration circuit 230 according to an example. The acceleration circuit 230 includes the support circuits 240 and a kernel 238. In the example, the support circuits 240 include a PCIe endpoint circuit ("PCIe endpoint 302"), a PCIe DMA controller 304, interconnect circuits ("interconnect 306"), memory controllers 310, and memory interfaces 312. The support circuits 240 can include other circuits, which are omitted for clarity (e.g., decoupler circuits, debug circuits, etc.). The PCIe endpoint 302 provides a physical interface to the peripheral bus 215. The PCIe DMA controller 304 facilitates DMA operations to the RAM 226 and the kernel 238. The interconnect 306 couples the PCIe DMA controller 304 to the memory controllers 310 and to the kernel 238. The memory controllers 310 are coupled to the memory interfaces 312. The memory interfaces 312 are coupled to the RAM 226.

In operation, the acceleration libraries 246 can access the RAM 226 directly through the PCIe DMA controller 304. The acceleration libraries 246 can also access the kernel 238 through the PCIe DMA controller 304. The kernel 238 can access the RAM 226 through the memory controllers 310. Data can be exchanged between the software 206 and the kernel 238 using DMA operations between the system memory 216 and the RAM 226.

In the example, the kernel 238 uses interfaces 330, 331, and 332 to communicate with the interconnect 306. In particular, these interfaces include a first read interface 330, a second read interface 331, and a read/write interface 332. For example, the read interface 330 can be used as a control interface for controlling the kernel 238. The read interface 331 can be used to read from the RAM 226 through a first one of the memory interfaces 312. The read/write interface 332 can be used to read and write from the RAM 226 through a second one of the memory interfaces 312.

The kernel 238 includes an interconnect interface 304, control logic 342, and processing circuits 341. The processing circuits 341 include an IM2COL circuit ("IM2COL 344"), a read control circuit ("read control 346"), a multiplexer 356, first-in-first-out circuits ("FIFOs 358"), digital signal processor (DSP) array 362, a scaler circuit ("scaler 364"), a max pool circuit ("max pool 366"), a multiplexer 368, FIFOs 354, write control circuit ("write control 352"), a cache 348, a read control circuit ("read control 350"), and FIFOs 360. The interconnect interface 340 is coupled to the interfaces 330, 331, and 332, the control logic 342, and the processing circuits 341. The interconnect interface 340 can include switches, clock converters, and the like to facilitate communication between the control logic 342 and the interface 330, as well as between the processing circuits 341 and the interfaces 331 and 332.

In the example, the interconnect interface 340 is coupled to inputs of the IM2COL circuit 344, the read control circuit 346, the cache 348, and the write control circuit 352. Outputs of the IM2COL circuit 344 and the read control circuit 346 are coupled to inputs of the multiplexer 356. An output of the multiplexer 356 is coupled to an input of the FIFOs 358. An output of the FIFOs 358 is coupled to a first input of the DSP array 362. An output of the cache 348 is coupled to an input of the read control circuit 350. An output of the read control circuit 350 is coupled to an input of the FIFOs 360. An output of the FIFOs 360 is coupled to a second input of the DSP array 362. An output of the DSP array 362 is coupled to an input of the scaler 364. An output of the scaler 364 is coupled to an input of the max pool circuit 366 and an input of the multiplexer 368. An output of the max pool circuit 366 is coupled to another input of the multiplexer 368. An output of the multiplexer 368 is coupled to an input of the FIFOs 354. An output of the FIFOs 354 is coupled to the write control circuit 352.

In operation, the DSP array 362 performs matrix multiplication operations for implementing a neural network. The inputs of the DSP array 362 receive input activation matrices from the FIFOs 358 and weight matrices from the FIFOs 360. The input activation matrices can be read directly from the RAM 226 using the read control circuit 346. Alternatively, the input activations can be read from the RAM 226 and processed by the IM2COL circuit 344 for input to the DSP array 362. Embodiments of the IM2COL circuit 344 are described below. Weight matrices can be read from the RAM 226 by the read control circuit 350 and cached in cache 348. The scaler 364 can scale the output of the DSP array 362. The max pool circuit 366 can implement a max pooling function on the scaled output of the DSP array 362. In one example, the max pool circuit 966 is implemented using CLBs or other configurable logic. Either the output of the max pool circuit 366 or the scaler 364 can be stored in the FIFOs 354. The write control circuit 352 writes data in the FIFOs to the RAM 226. The control logic 342 controls the various circuits in the processing circuits 341, such as the IM2COL circuit 344, the read control circuit 346, the multiplexers 356 and 368, the read control circuit 350, and the scaler 364, the max pool circuit 366, and the write control circuit 352.

Figure 4:
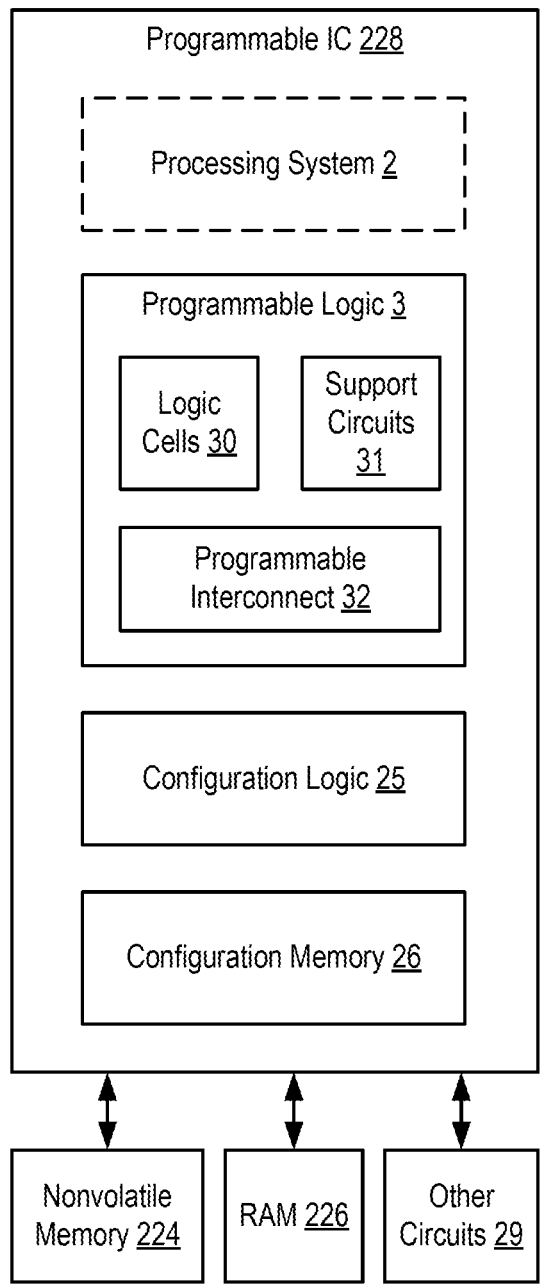
FIG. 4 is a block diagram depicting a programmable integrated circuit (IC) according to an example.

FIG. 4 is a block diagram depicting a programmable IC 228 according to an example. The programmable IC 228 includes programmable logic 3, configuration logic 25, and configuration memory 26. The programmable IC 228 can be coupled to external circuits, such as the NVM 224, the RAM 226, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 224 or any other source (e.g., the DRAM 28 or from the other circuits 29). In some examples, the programmable IC 228 includes a processing system 2. The processing system 2 can include microprocessor(s), memory, support circuits, IO circuits, and the like. For example, the processing system 2 can include circuits similar to the processing system 210. In some examples, the processing system 2 can be used in place of the processing system 210. In such case, the entire computing system 108 can be implemented using the programmable IC 228, where the software 206 executes on the processing system 2.

Figure 5:
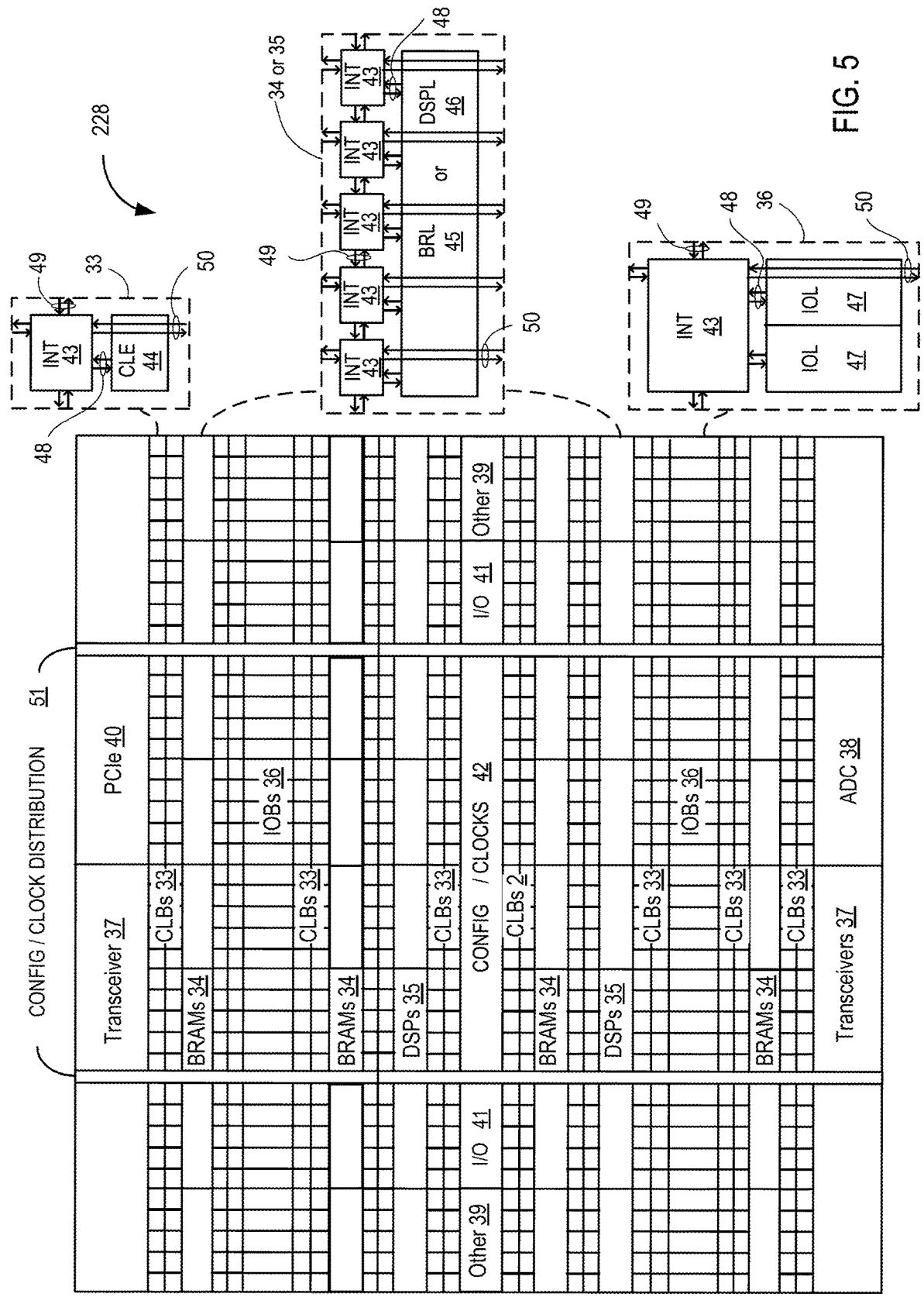
FIG. 5 illustrates a field programmable gate array (FPGA) implementation of a programmable IC according to an example.

FIG. 5 illustrates an FPGA implementation of the programmable IC 228 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 5. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 8) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic.

Note that FIG. 5 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 6:
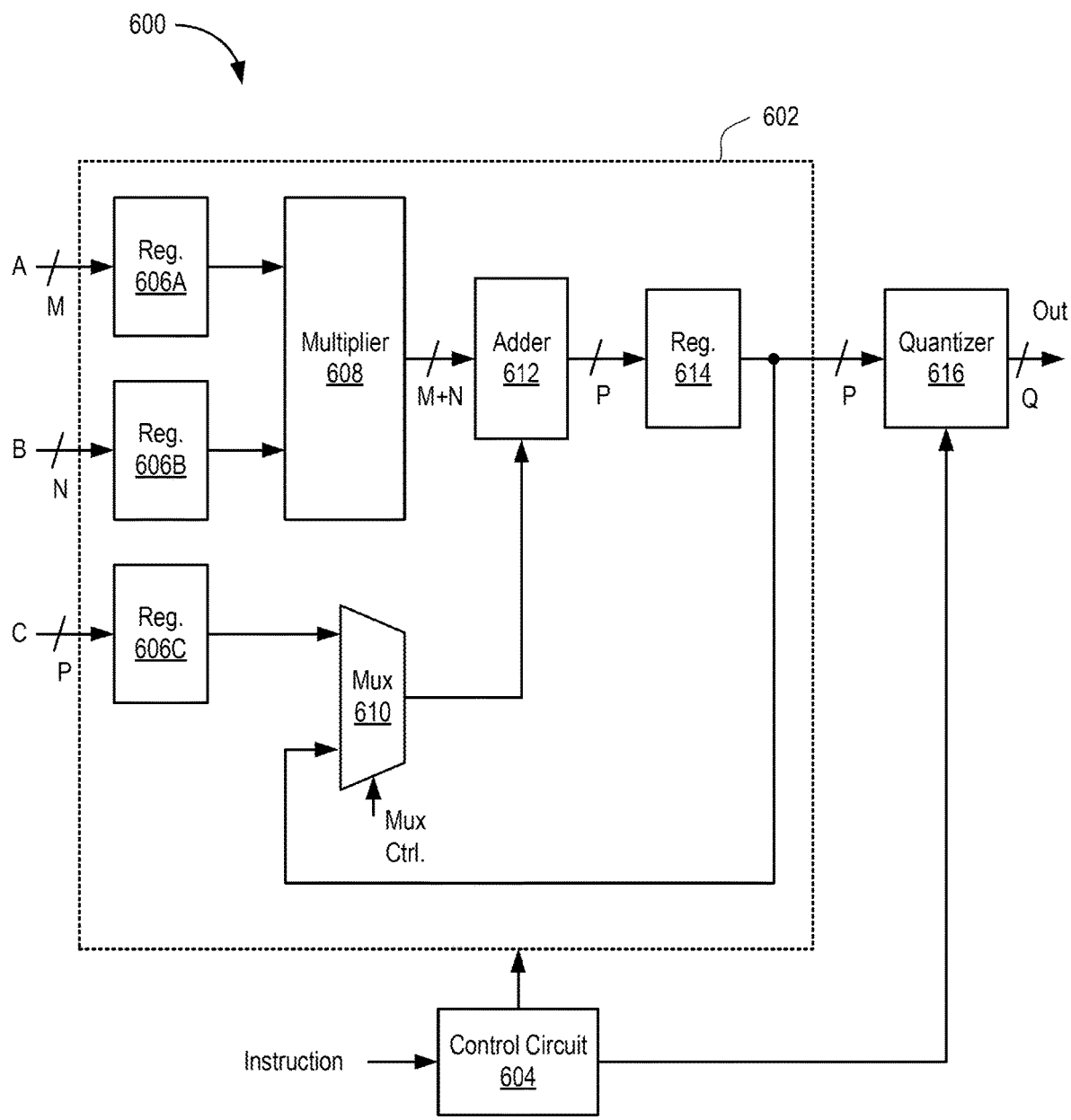
FIG. 6 is a block diagram depicting a multiply-accumulate (MACC) circuit according to an example.

Software-Driven Design Optimization for Fixed-Point Multiply-Accumulate Circuitry FIG. 6 is a block diagram depicting a multiply-accumulate (MACC) circuit 600 according to an example. The MACC circuit 600 can be used as a computation element in the DSP array 362. The DSP array 362 can include any number of instances of the MACC circuit 600.

The MACC circuit 600 includes a multiply-accumulator 602, a quantizer 616, and a control circuit 604. The multiply-accumulator 602 includes three inputs designated A, B, and C. The A input has a width of M, the B input has a width of N, and the C input has a width of P, where M, N, and P are positive integers. The multiply-accumulator 602 includes an output having a width of P coupled to an input of the quantizer 616. The quantizer 616 has an output having a width of Q, where Q is a positive integer. Outputs of the control circuit 604 are coupled to control inputs of the multiply-accumulator 602 and the quantizer 616. An input of the control circuit 604 receives an instruction for configuring the multiply-accumulator 602 and the quantizer 616.

In the example, the multiply-accumulator 602 includes registers 606A ... 606C, a multiplier 608, a multiplexer 610, an adder 612, and a register 614. Inputs of the registers 606A ... 606C are respectively coupled to the A, B, and C inputs of the multiply-accumulator 602. Outputs of the registers 606A and 606B are coupled to inputs of the multiplier 608. An output of the multiplier 608, having a width M+N, is coupled to an input of the adder 612. An output of the adder 612, having a width of P, is coupled to a register 614. An output of the register 614 provides the output of the multiply-accumulator 602. An output of the register 606C is coupled to one input of the multiplexer 610. The output of the register 614 is coupled to another input of the multiplexer 610. An output of the multiplexer 610 is coupled to another input of the adder 612. A control input of the multiplexer 610 receives a control signal (Mux Ctrl.) from the control circuit 604.

In operation, the multiplier 608 performs multiplications of A and B. When the multiplexer 610 selects the output of the register 614, the adder 612 operates as an accumulator to accumulate the output of the multiplier 608. Otherwise, the adder 612 performs a sum of A×B and C. The register 614 stores the output of the adder 612. The quantizer 616 reduces the resolution of the P-bit output of the multiply-accumulator 602 to a Q-bit output (e.g., Q<P). For example, P can be 48 bits and Q can be 8 bits or 16 bits. Operation of the quantizer 616 is discussed further below. The control circuit 604 is configured to provide control data to the quantizer 616. The control data is indicative of a most-significant bit (MSB) to least significant bit (LSB) range for selecting bit indices from the register 614.

Figure 7:
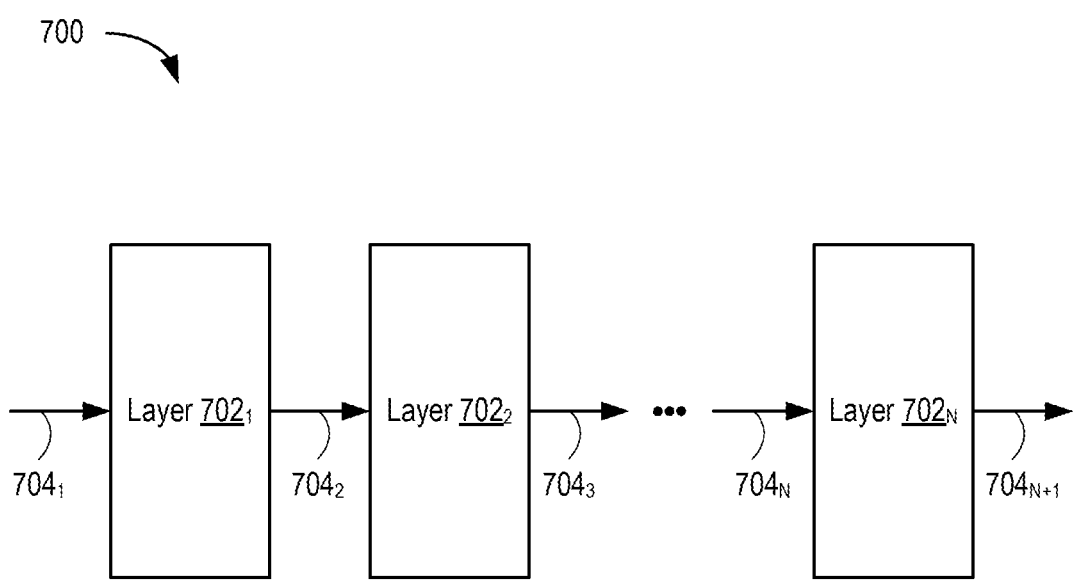
FIG. 7 is a block diagram depicting a neural network according to an example.

FIG. 7 is a block diagram depicting a neural network 700 according to an example. The neural network 700 includes a plurality of layers 702, e.g., layers $702_1 \ldots 702_N$, where N is an integer greater than zero. Each layer 702 has an input and an output. The layer $702_1$ has an input $704_1$ and an output $704_2$. The input to the layer $702_2$ is the output $704_2$ of the layer $702_1$. The layer $702_2$ includes an output $704_3$. An output of a layer $702_{N-1}$ (not shown) is the input of the layer $702_N$. The layer $702_N$ includes an output $704_{N+1}$. Thus, the input of the neural network 700 is the input $704_1$ and the output of the neural network is the layer $702_{N+1}$. In an example, one or more of the layers 702 is a convolutional layer. Each convolutional layer can include further post-processing (not shown) of its output, such as ReLU, max pooling, scaling, or the like. The convolution operations for a convolutional layer are implemented by the processor 606. The input to a convolutional layer is formatted by the IM2COL circuit.

Figure 8:
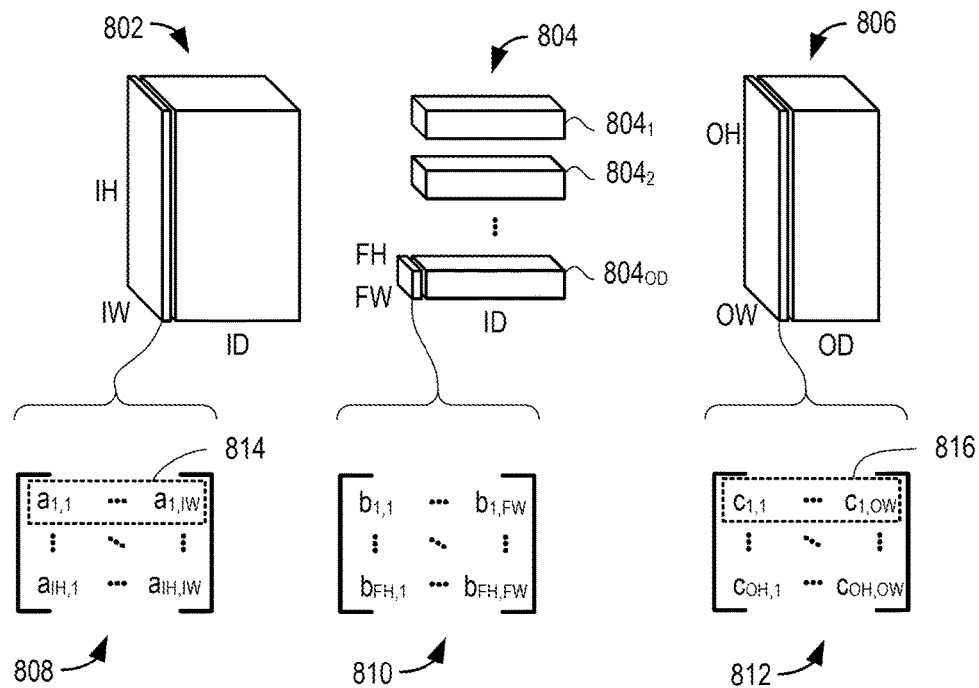
FIG. 8 illustrates input image data, filter data, and output image data for a convolution operation according to an example.

FIG. 8 illustrates input image data 802, filter data 804, and output image data 806 for a convolution operation according to an example. The convolution operation can be performed for a particular layer of a CNN, for example. The input image data 802 includes two-dimensional images, each having a width (IW) and a height (IH), for each of a number of channels (ID). Thus, the input image data 802 comprises an IW×IH×ID volume of image samples. For example, the input image data 802 can include 227×277 images in each of red, green, and blue (RGB) channels (e.g., 227×227×3). In another example, an inner convolutional layer of a CNN can include input image data with dimensions 55×55×96 (e.g., 96 channels each having a 55×55 image). Each image 808 can be represented by a two-dimensional matrix $A=(a_{ij})_{IH \times IW}$. Each image 808 includes an IH number of rows 814. The IM2COL circuit processes an image 808 on a row-by-row basis.

In some cases, each image 808 can be padded with columns of zero-value samples on the left and right edges and/or rows of zero-value samples on the top and bottom edges. Padding is represented by numbers PH and PW, where PH is padding height and PW is padding width. For example, PH=PW=0 is no padding; PH=PW=1 means a ring of zero-value samples surrounds the image samples; PH=1 means that one row of zero-value samples is added to the top edge and another row of zero-value samples is added to the bottom edge; and PW=2 means that two columns of zero-value samples are added to the right edge and another two columns of zero-value samples are added to the left edge.

The filter data 804 includes three-dimensional filters $804_1 \ldots 804_{OD}$, each having a width (FW), a height (FH), and the depth (ID). The terms "filter" and "kernel" are used interchangeably herein. Each three-dimensional filter $804_1 \ldots 804_{OD}$ is convolved with the input image data 802 to generate a respective channel of the output image data 806. Thus, the number of three-dimensional filters $804_1 \ldots 804_{OD}$ equals the depth (OD) of the output image. Also, the depth of each three-dimensional filter $804_1 \ldots 804_{OD}$ matches the depth (ID) of the input image data 802. For example, a convolutional layer of a CNN can include 96 three-dimensional filters having dimensions of 11×11×3. Each two-dimensional cross-section of a filter $804_1 \ldots 804_{OD}$ can be represented by a two-dimensional matrix $B=(b_{ij})_{FH \times FW}$.

The output image data 806 includes two-dimensional images, each having a width (OW) and a height (IH), for a number (OD) of channels. Thus, the output image data 806 forms an OW×OH×OD volume. For example, the output image data 806 can include 96 channels each having a 55×55 image. Each image 816 can be represented by a two-dimensional matrix $C=(c_{ij})_{OH \times OW}$. Each image 816 includes an OH number of rows.

The values of OH and OW depend on the filter dimensions (FH, FW), input image padding (PH, PW), horizontal stride ($S_h$), vertical stride ($S_v$), horizontal dilation ($D_h$), and vertical dilation ($D_v$). Notably, $$OH = \left\lfloor \frac{IH + 2 \cdot PH - ((D_v + 1) \cdot (FH - 1) + 1)}{S_v} \right\rfloor + 1$$

and $$OW = \left\lfloor \frac{IW + 2 \cdot PW - ((D_h - 1) \cdot (FW - 1) + 1)}{S_h} \right\rfloor + 1.$$

To ensure that the entire image is processed, the expression $(IH+2PH-((D_v+1)(FH-1)+1))$ should evaluate to be a multiple of $S_v$, and the expression $(IW+2PW-((D_h+1)(FW-1)+1))$ should evaluate to be a multiple of $S_h$.

An output sample in an output image 812 depends on a neighborhood of input samples in each input image 808 referred to herein as a "receptive field." Each receptive field includes FH×FW input samples. A given output sample $c_{ij}$ in the output image 812 is computed by taking the dot product between vector of its receptive fields and a vector of given filter. Thus, the receptive fields of a given output sample $c_{ij}$ include a volume of input samples equal to ID×FH×FW samples. The size of the receptive fields depends on the filter dimensions (FH, FW). The input samples of the receptive fields and the extent to which the receptive fields overlap one another depend on the stride and dilation parameters of the convolution and the padding of the input image data.

Figure 9:
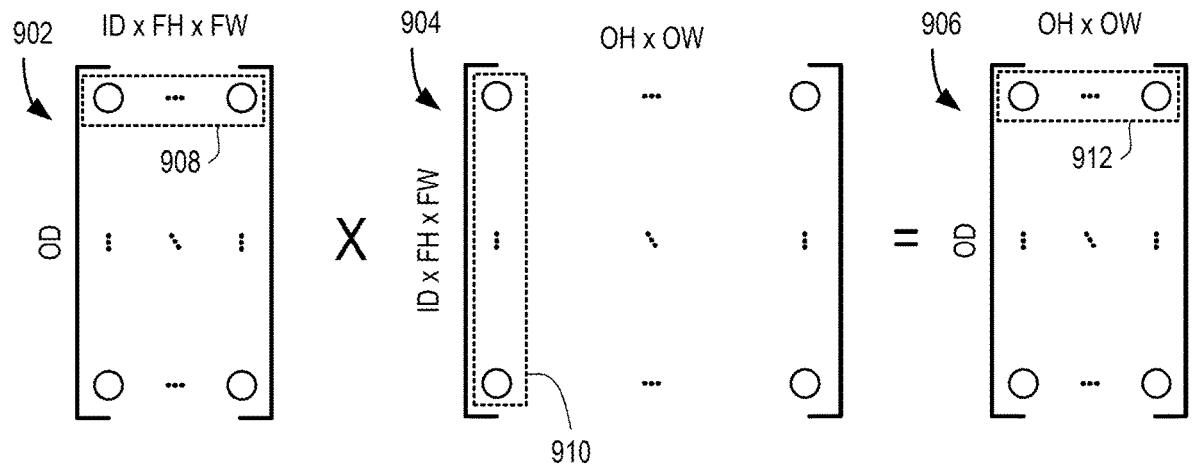
FIG. 9 illustrates convolution in terms of a two-dimensional matrix multiplication operation.

FIG. 9 illustrates convolution in terms of a two-dimensional matrix multiplication operation. A filter matrix 906 has an OD number of rows and an (ID×FH×FW) number of columns. In the filter matrix 906, each of the filters $804_1 \ldots 804_{OD}$ is converted into a vector having an (ID×FH×FW) number of elements. Each "vectorized" filter becomes a row 908 of the filter matrix 906.

An output image matrix 906 has an OD number of rows and an (OH×OW) number of columns. Each row 912 of the output image matrix 906 is a vectorized form of an output image 812. The output image matrix 906 includes an OD number of rows representing an OD number of channels of the output image data 806.

An input image matrix 904 has ID×FH×FW number of rows and OH×OW number of columns. The input image matrix 904 is formed so that each column 910 includes the receptive fields for a given output sample. Thus, the input image matrix 904 depends on filter size (FH, FW) and padding (PH, PW), as well as stride and dilation selected for the convolution.

In one technique, a processor can perform convolution by generating the matrices 902, 904, and 906 and performing the matrix multiplication operation. However, such a technique requires generation of the large input image matrix 904 using an image-to-column (IM2COL) process. The input image matrix 904 includes redundant data (e.g., image samples are repeated across the columns according to a particular pattern according to the defined overlap of receptive fields). For example, consider an input image data having 227×227×3 image samples (e.g., RGB image having height and width of 227 pixels each without padding).

Assume further an 11×11×3 filter and a stride of four. In such an example, the input image data 802 includes 154,587 image samples, but the input image matrix 904 includes 1,098,075 image samples. If each image sample is one byte, generation of the input image matrix 904 requires approximately 1 MB of temporary storage. Of course, larger input sample sizes require even more temporary storage. Furthermore, computation of the input image matrix 904 requires complete traversal of the input image data 802 prior to performing the convolution operation.

As illustrated in FIGS. 8-9, the multiply-accumulate operations found in convolutional neural networks are of the form z=xy+z. When implemented using fixed-point arithmetic, x, y, and z can be quantized based on a bit width (bw) and a fractional length (fl). That is, a two's complement base-2 little endian integer $b_{bw-1}, \ldots, b_1, b_0$ represents the value:

$$\left( -b_{bw-1} 2^{bw-1} + \sum_{i=0}^{bw-2} b_i 2^i \right) 2^{-fl}$$

Figures 10, 11:
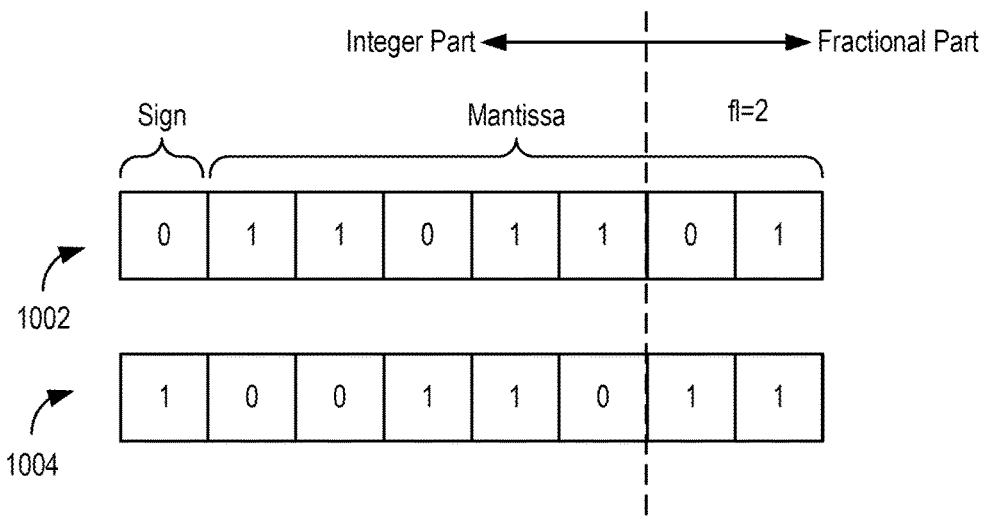
FIG. 10 illustrates a pair of fixed-point integers according to an example.
FIG. 11 depicts a table that shows determined most-significant bit (MSB) and least-significant bit (LSB) values for different layers of a neural network according to an example.

FIG. 10 illustrates a pair of fixed-point integers according to an example. Each integer 1002 and 1004 includes a most-significant bit (MSB) that represents the sign of the integer. The integer 1002 is positive and the integer 1004 is negative. The least significant bits (LSBs) are used to represent the magnitude of the integer using an integer part and a fractional part. The integer part includes a mantissa and the fractional part includes zero or more fractional digits (e.g., fl=2 in the present example). If fl=0, the integer 1002 has the value 109. However, in the example where fl=2, the integer 1002 has the value 27.25. If fl=0, the integer 1004 has the value −101. However, in the example where fl=2, the integer 1004 has the value −26.75. Note that the integers 1002 and 1004 can be interpreted to have different values depending on the hyper-parameter fl. However, to the multiply-accumulator 602, the integers 1002 and 1004 are processed in the same manner regardless of the value of fl. That is, the multiply-accumulator 602 functions the same regardless of the value of fl.

If the multiplier x and the multiplicand y are given bit widths x_bw and y_bw, respectively, then the minimum (pre-rounding) accumulator bit width for their product is acc_bw=x_bw+y_bw. A larger bit width can be selected to prevent potential overflow or the accumulator can be clamped in the case of overflow. Similarly, the accumulator fractional length is acc_fl=x_fl+y_fl. Finally, provided the final desired product bit width z_bw and fractional length z_fl, the appropriate accumulator bits that must be selected are $[b_{x\_fl+y\_fl-z\_fl+z\_bw-1}, b_{x\_fl+y\_fl-z\_fl}]$ rounded according to a selected function of $b_{x\_fl+y\_fl-z\_fl-1}, \ldots, b_1, b_0$.

Consider the following examples. Assume the image samples and weights are 8-bit values and that the accumulator output has a width of 16 bits. Assumer further that the quantizer has an output bit width of 8 bits. Thus, the quantizer selects 8 bits out of the 16 bits output by the accumulator. The bits selected depend on the width of the fractional portions of the image and weight samples. For example, assume the image samples have a fractional length of zero (fl=0) and the weights have a fractional length of 7 (fl=7). In such case, the fractional length of the accumulator output is 7. The quantizer is configured to select bits $b_{17} \ldots b_{10}$ where the fractional length is −3. Consider another example where the fractional length of the image samples is −3 and the fractional length of the weights is 7. In such case, the fractional length of the accumulator output is 4. The quantizer selects bits $b_{15} \ldots b_8$ where the fractional length is −4.

Provided a quantization for a target CNN, software can analyze the accumulator bit widths and fractional lengths for each layer to determine the MSB and LSB of accumulator output that needs to be selected. FIG. 11 depicts a table 1100 that shows determined MSB and LSB values for different layers of a CNN according to an example. The table shows values for five layers of a given CNN. Each layer is defined by an image sample bit width (x_bw), an image sample fractional length (x_fl), a weight sample bit width (y_bw), a weight sample fractional length (y_fl), a quantized sample bit width (z_bw), and a quantized sample fractional length (z_fl). The table 1100 also shows the bitwidth of the accumulator (acc_bw), the fractional length of the accumulator (acc_fl), the selected MSB (MSB), and the selected LSB (LSB). For layer 1, MSB is 17 and LSB is 10. In such case, the quantizer 616 selects bits $b_{17} \ldots b_{10}$ from the accumulator output (note that accumulator output can be sign-extended to generate $b_{17}$ from the 16-bit output). For layer 2, MSB is 15 and LSB is 8. In such case, the quantizer 616 selects bits $b_{15} \ldots b_8$ from the accumulator output. It can be seen from the table 1100, there are four unique values of MSB and four unique values of LSB. Thus, there are only four bit indices from which the LSB (and MSB) are selected.

Figure 12:
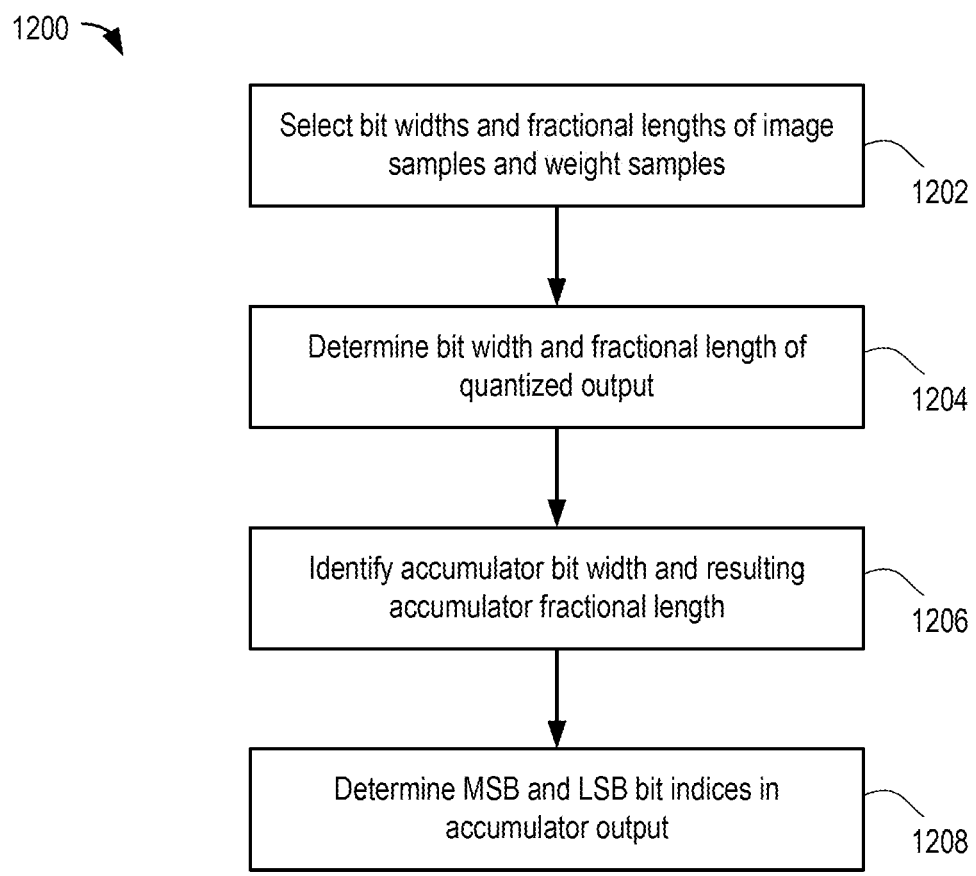
FIG. 12 is a flow diagram depicting a method of determining MSB and LSB bit indices of accumulator output for layers of a neural network according to an example.

FIG. 12 is a flow diagram depicting a method 1200 of determining MSB and LSB bit indices of accumulator output for layers of a CNN according to an example. The method 1200 can be performed by the design tool(s) 104 executing in the computer 104 or by software executing in the computer system(s) 108 (e.g., applications 112, acceleration libraries 114, etc.).

The method 1200 begins at step 1202, where the software selects bit widths and fractional lengths of the image samples and the weight samples. For example, each layer of a CNN can have the same or different values for these parameters (e.g., as shown in the table 1100). At step 1204, the software determines a bit width and fractional length of the quantized output of the MACC circuit 600. At step 1206, the software identifies accumulator bit width and the resulting accumulator fractional lengths for each layer. The accumulator bit width is typically fixed by the hardware used (e.g., the MACC circuit 600). The accumulator fractional length depends on the image sample fractional length and the weight fractional length. At step 1208, the software determines the MSB and LSB indices in the accumulator output. For example, the software determines the appropriate accumulator bits as $[b_{x\_fl+y\_fl-z\_fl+z\_bw-1}, b_{x\_fl+y\_fl-z\_fl}]$ rounded according to a selected function of $b_{x\_fl+y\_fl-z\_fl-1}, \ldots, b_1, b_0$.

As described above, the quantizer 616 needs to select a number of bits from the accumulator output between two bit indices. In an example, the accumulator output has a bit width of 16 and the quantized output has a bit width of 8. In such case, the quantizer 616 can include eight 16:1 multiplexers to select among the bit indices for the MSB and LSB. However, as noted above, only a certain number of LSB (and MSB) bit indices are selected for the layers of a given CNN (e.g., four different LSB bit indices in the example table 1100). Thus, in an example, the quantizer 616 can be optimized to use just eight 4:1 multiplexers, since several of the bit indices in the accumulator output are never selected in the quantized output. In another example, the quantizer 616 can be implemented using a shift register that shifts the accumulator output by a given amount to select the quantized output bits. Without optimization, the quantizer 616 would waste cycles shifting right by one bit per clock cycle before reaching the desired LSB. In an example, the quantizer 616 can be optimized by immediately bypassing some of the bits that cannot be the LSB. Thus, the quantizer 616 can be customized based on the target CNN, which conserves processing time and resources. Moreover, in an example, the complexity of the quantizer 616 can be further reduced by manipulating the chosen bit widths and fractional lengths of the multiplier x, the multiplicand y, and the product z for each layer during training so that the desired LSB distribution condenses, potentially to a single bit index for all layers. In such case, this eliminates the need for the quantizer 616 to have any multiplexers or use any clock cycles to shift to the desired LSB.

Figure 13A:
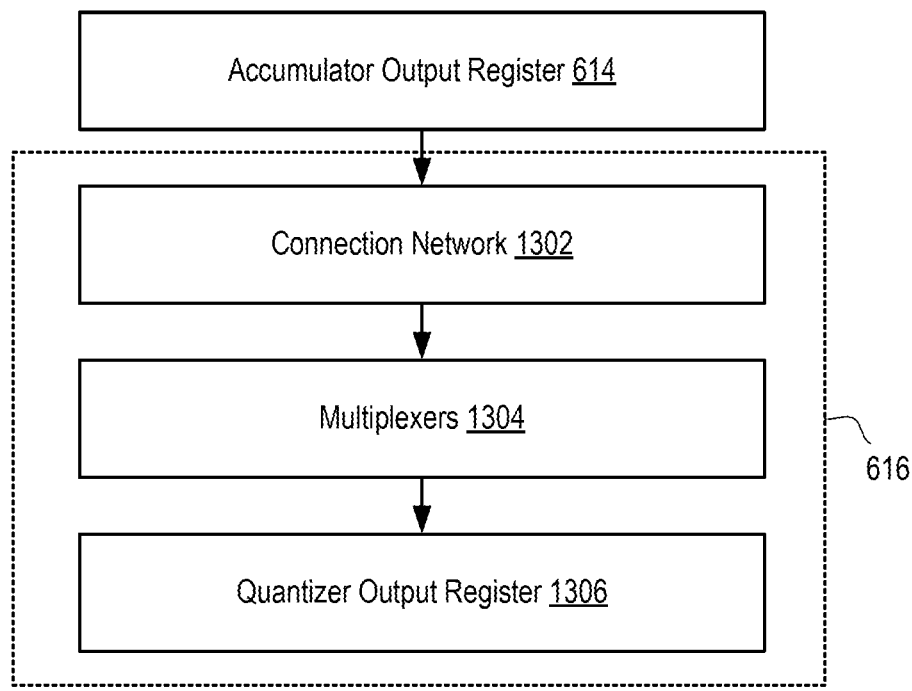
FIGS. 13A-B are block diagrams depicting a quantizer according to an example.
Figure 13B:
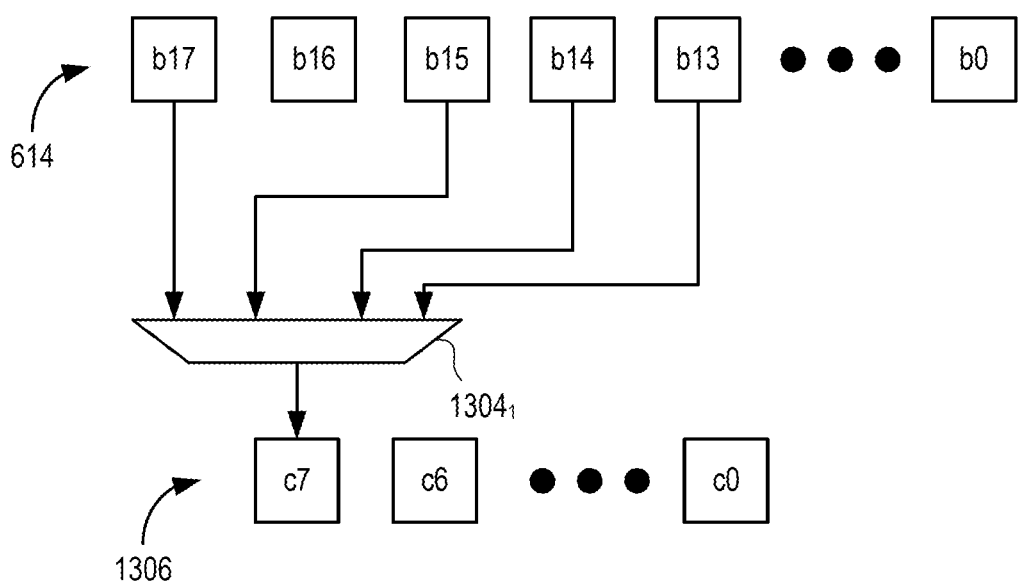

FIG. 13A is a block diagram depicting the quantizer 616 according to an example. The quantizer 616 includes a connection network 1302, multiplexers 1304, and a quantizer output register 1306. The connection network 1302 connects the bits of the accumulator output register 614 to inputs of the multiplexers 1304 based on the analysis performed by the method 1200. Outputs of the multiplexers 1304 are coupled to the quantizer output register 1306. FIG. 13B is a block diagram depicting connection to the bit c7 of the quantizer output register 1306 according to an example where the quantizer output register 1306 has eight bits. According to the table 1100, in this particular target CNN, the possible MSB values are selected from b17, b15, b14, and b13 of the accumulator output register 614. Thus, a multiplexer $1304_1$ includes four inputs and selects among those bit indices to provide the value of C7. Other bit indices of the quantizer output register 1306 are loaded similarly. In the example, for eight bits of the quantizer output register 1306, the multiplexers 1304 include eight 4-input multiplexers. The connection network 1302 is configured to connect the appropriate bit indices of the accumulator output register 614 to the inputs of each multiplexer 1304 to load the appropriate bit index of the quantizer output register 1306.

Figure 14A:
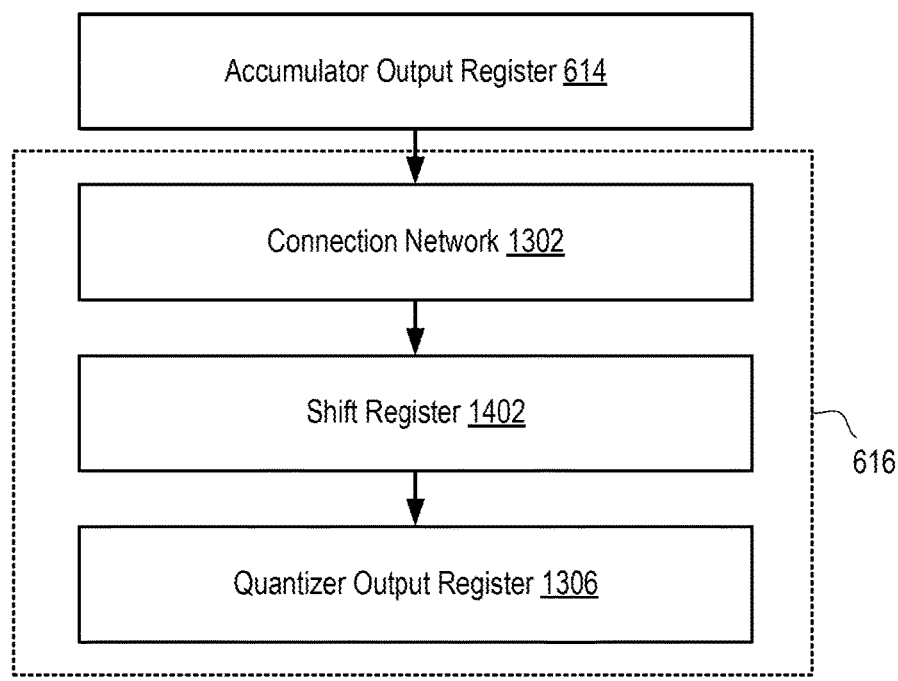
FIGS. 14A-B are block diagrams depicting a quantizer according to another example.
Figure 14B:
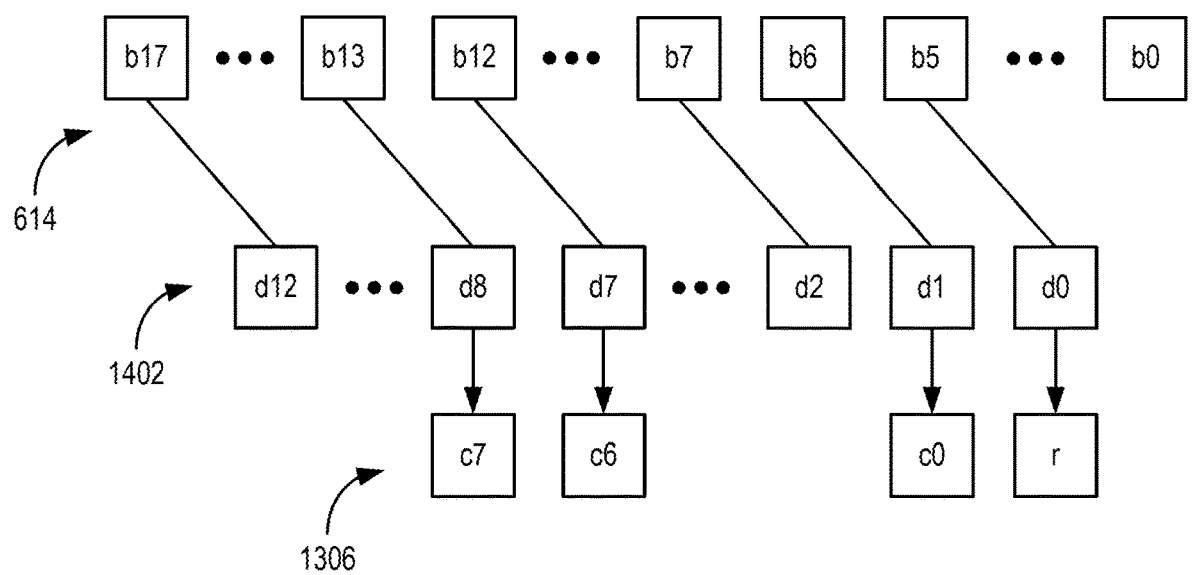

FIG. 14A is a block diagram depicting the quantizer 616 according to another example. The quantizer 616 in the present example includes a shift register 1402 in place of the multiplexers 1304. FIG. 14B is a block diagram depicting connections between the accumulator output register 614, the shift register 1402, and the quantizer output register 1306. The connection network 1302 connects bit indices b17 . . . b5 of the accumulator output register 614 to bit indices d12 . . . d0 of the shift register 1402. Notably, the connection network 1302 does not include connections between bit indices b4 . . . b0, since those bit indices are not potential LSBs (according to the example table 1100). The bit indices d8 . . . d0 of the shift register 1402 are coupled to the bit indices c7 . . . c0 and r of the quantizer output register 1306. In this example, the bit index designated "r" is an extra bit used to store a remainder value (e.g., the quantizer output register 1306 has a bitwidth of nine).

Figure 15:
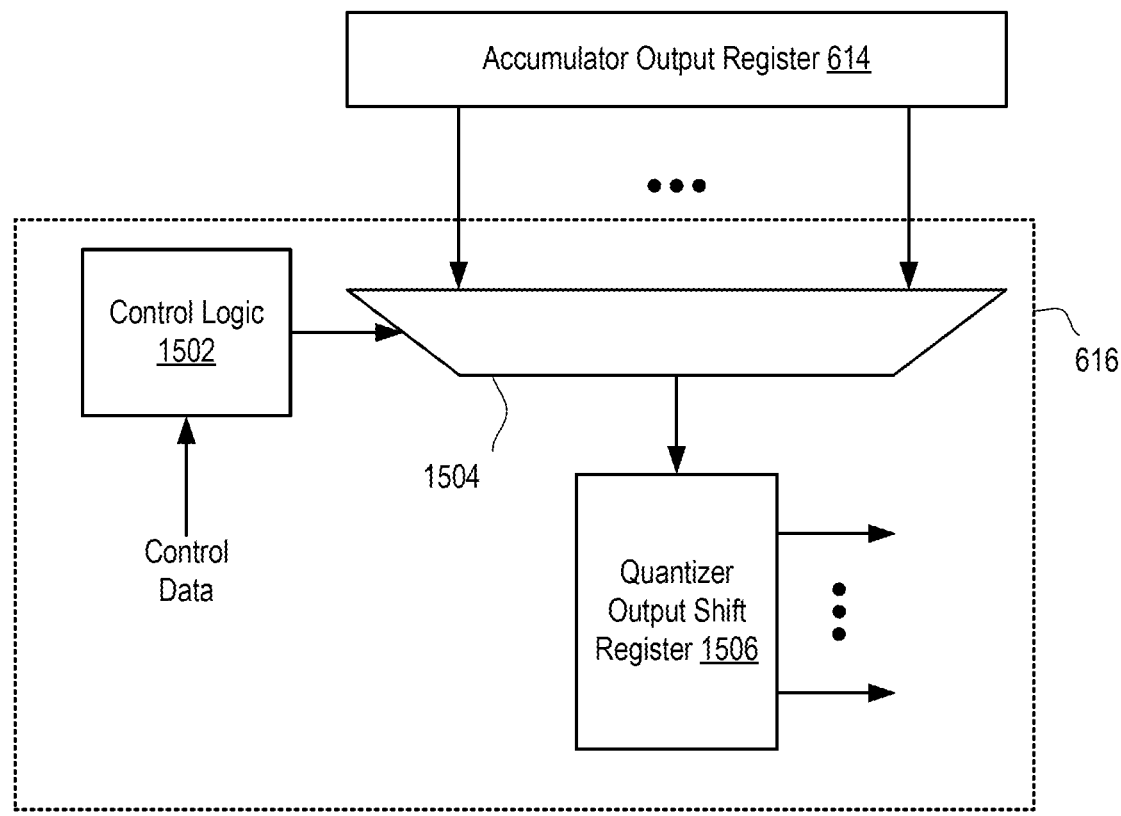
FIG. 15 is a block diagram depicting a quantizer according to yet another example.

FIG. 15 is a block diagram depicting the quantizer 616 according to another example. In the present example, the quantizer 616 includes control logic 1502, a multiplexer 1504, and a quantizer output shift register 1506. Inputs of the multiplexer 1504 are coupled to outputs of the accumulator output register 614. In an example, the multiplexer 1504 is coupled to only a portion of the outputs of the accumulator output register 614 (e.g., those bit indices that are never used in the quantized output can be omitted from being connected to the multiplexer 1504). An output of the multiplexer 1504 is coupled to a shift input of the quantizer output shift register 1506. An output of the control logic 1502 is coupled to a control input of the multiplexer 1504. The quantizer output shift register 1506 can include a parallel output.

In operation, the control logic 1502 receives control data indicating the range of MSB to LSB to be selected from the accumulator output register 614. The control logic 1502 controls the multiplexer to select the bit indices of the accumulator output register 614 from MSB to LSB (or from LSB to MSB) to serially load the quantizer output shift register 1506. The quantizer output shift register 1506 then outputs the data through the parallel output.

Figure 16:
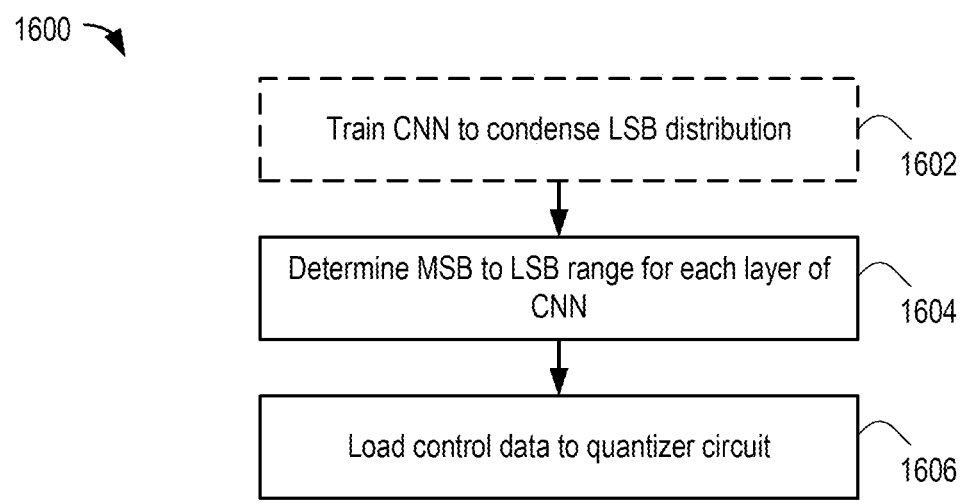
FIG. 16 is a flow diagram depicting a method of operating a MACC circuit according to an example.

FIG. 16 is a flow diagram depicting a method 1600 of operating the MACC circuit 600 according to an example. The method 1600 begins at step 1604, where the MSB to LSB range for each layer is determined. For example, software can execute the method 1200 described above to determine MSB to LSB ranges for the CNN layers. At step 1606, control data indicative of the MSB to LSB ranges is loaded to the quantizer circuit 616. For example, the ranges can be provided by the instruction to the control circuit 604, which in turn provides the range data to the quantizer 616. At optional step 1602, software can train the CNN to condense the LSB distribution. As described above, the complexity of the quantizer 616 can be further reduced by manipulating the chosen bit widths and fractional lengths of the multiplier x, the multiplicand y, and the product z for each layer during training so that the desired LSB distribution condenses, potentially to a single bit index for all layers. In such case, this eliminates the need for the quantizer 616 to have any multiplexers or use any clock cycles to shift to the desired LSB.

While the foregoing is directed to specific examples, other and further examples may be devised without departing from the basic scope thereof, and the scope thereof is determined by the claims that follow.

What is claimed is:

1. A multiply accumulate (MACC) circuit, comprising:
   a multiply-accumulator having an accumulator output register;
   a quantizer, coupled to the multiply-accumulator, the quantizer configured to reduce resolution of data in the accumulator output register; and
   a control circuit coupled to the multiply-accumulator and the quantizer, the control circuit configured to provide control data to the quantizer, the control data including a most-significant bit (MSB) to least significant bit (LSB) range for selecting bit indices from the accumulator output register, wherein the control circuit is included in a processor and is configured to receive from the processor an MSB of the MSB to LSB range and an LSB of the MSB to LSB range, the processor being configured to generate the MSB of the MSB to LSB range based on a function of a fractional length of an image sample, a fractional length of a weight sample, a bit width of an output of the quantizer, and a fractional length of the output of the quantizer, and the LSB of the MSB to LSB range based on a function of the fractional length of the image sample, the fractional length of the weight sample, and the fractional length of the output of the quantizer.

2. The MACC circuit of claim 1, wherein the quantizer comprises:
   a plurality of multiplexers;
   a connection network configured to couple a portion of the bit indices of the accumulator output register to the plurality of multiplexers; and
   a quantizer output register coupled to outputs of the plurality of multiplexers.

3. The MACC circuit of claim 2, wherein each of the plurality of multiplexers comprises a plurality of inputs, and wherein the plurality of inputs of each of the plurality of multiplexers is coupled to a respective plurality of the bit indices of the accumulator output register.

4. The MACC circuit of claim 1, wherein the quantizer comprises:
   a shift register;
   a connection network configured to couple a portion of the bit indices of the accumulator output register to a plurality of bit indices of the shift register; and
   a quantizer output register coupled to the plurality of bit indices of the shift register.

5. The MACC circuit of claim 1, wherein the quantizer comprises:
   a multiplexer coupled to a portion of the bit indices of the accumulator output register;
   a quantizer output shift register coupled to an output of the multiplexer; and
   control logic coupled to a control input of the multiplexer.

6. The MACC circuit of claim 5, wherein the control logic is configured to control the multiplexer based on the MSB to LSB range.

7. An integrated circuit (IC), comprising:
   a memory controller configured to access a memory having image data and weight data stored therein;
   a processor including a plurality of multiply-accumulate (MACC) circuits configured to process the image data and the weight data, each of the MACC circuits including:
      a multiply-accumulator having an accumulator output register;
      a quantizer, coupled to the multiply-accumulator, the quantizer configured to reduce resolution of data in the accumulator output register; and
      a control circuit coupled to the multiply-accumulator and the quantizer, the control circuit configured to provide control data to the quantizer, the control data including a most-significant bit (MSB) to least significant bit (LSB) range for selecting bit indices from the accumulator output register, wherein the processor is configured to determine an MSB of the MSB to LSB range based on a function of a fractional length of an image sample of the image data, a fractional length of a weight sample of the weight data, a bit width of an output of the quantizer, and a fractional length of the output of the quantizer, and an LSB of the MSB to LSB range based on a function of the fractional length of the image sample, the fractional length of the weight sample, and the fractional length of the output of the quantizer.

8. The IC of claim 7, wherein the quantizer comprises:
   a plurality of multiplexers;
   a connection network configured to couple a portion of the bit indices of the accumulator output register to the plurality of multiplexers; and
   a quantizer output register coupled to outputs of the plurality of multiplexers.

9. The IC of claim 8, wherein each of the plurality of multiplexers comprises a plurality of inputs, and wherein the plurality of inputs of each of the plurality of multiplexers is coupled to a respective plurality of the bit indices of the accumulator output register.

10. The IC of claim 7, wherein the quantizer comprises:
a shift register;
a connection network configured to couple a portion of the bit indices of the accumulator output register to a plurality of bit indices of the shift register; and
a quantizer output register coupled to the plurality of bit indices of the shift register.

11. The IC of claim 7, wherein the quantizer comprises:
a multiplexer coupled to a portion of the bit indices of the accumulator output register;
a quantizer output shift register coupled to an output of the multiplexer; and
control logic coupled to a control input of the multiplexer.

12. The IC of claim 11, wherein the control logic is configured to control the multiplexer based on the MSB to LSB range.

13. The IC of claim 7, further comprising programmable logic, wherein the quantizer and the control circuit are configured in the programmable logic.

14. A method of controlling a multiply-accumulate (MACC) circuit, comprising:
determining control data including a first most-significant bit (MSB) to least significant bit (LSB) range for selecting bit indices from an accumulator output register in the MACC, determining the control data comprising:
selecting a fractional length of an image sample and a fractional length of a weight sample;
determining a bit width of a quantized output and a fractional length of the quantized output; and
determining an MSB of the first MSB to LSB range based on a function of the fractional length of the image sample, the fractional length of the weight sample, the bit width of the quantized output, and the fractional length of the quantized output, and an LSB of the first MSB to LSB range based on a function of the fractional length of the image sample, the fractional length of the weight sample, and the fractional length of the quantized output; and
loading the control data to the MACC circuit to configure a quantizer coupled to the accumulator output register, the quantizer configured to reduce resolution of data in the accumulator output register.

15. The method of claim 14, wherein the fractional lengths of the image sample and weight sample correspond to a first layer of a convolutional neural network (CNN), wherein the control data further includes a second MSB to LSB range, determining the control data further comprising:
selecting a fractional length of an image sample and a fractional length of a weight sample corresponding to a second layer of the CNN; and
determining an MSB of the second MSB to LSB range based on a function of the fractional length of the image sample corresponding to the second layer, the fractional length of the weight sample corresponding to the second layer, the bit width of the quantized output, and the fractional length of the quantized output, and an LSB of the second MSB to LSB range based on a function of the fractional length of the image sample of the second layer, the fractional length of the weight sample of the second layer, and the fractional length of the quantized output.

16. The method of claim 14, wherein the quantizer comprises:
a plurality of multiplexers;
a connection network configured to couple a portion of the bit indices of the accumulator output register to the plurality of multiplexers; and
a quantizer output register coupled to outputs of the plurality of multiplexers.

17. The method of claim 16, wherein each of the plurality of multiplexers comprises a plurality of inputs, and wherein the plurality of inputs of each of the plurality of multiplexers is coupled to a respective plurality of the bit indices of the accumulator output register.

18. The method of claim 14, wherein the quantizer comprises:
a shift register;
a connection network configured to couple a portion of the bit indices of the accumulator output register to a plurality of bit indices of the shift register; and
a quantizer output register coupled to the plurality of bit indices of the shift register.

19. The method of claim 14, wherein the quantizer comprises:
a multiplexer coupled to a portion of the bit indices of the accumulator output register;
a quantizer output shift register coupled to an output of the multiplexer; and
control logic coupled to a control input of the multiplexer.

20. The method of claim 19, wherein the control logic is configured to control the multiplexer based on the first MSB to LSB range.

* * * * *